United States Patent
Takeda et al.

(10) Patent No.: US 9,528,178 B2
(45) Date of Patent: Dec. 27, 2016

(54) FASTENER ELEMENT FOR SLIDE FASTENERS

(75) Inventors: Hideki Takeda, Toyama (JP); Syoso Yamamoto, Toyama (JP); Hideyuki Yamaguchi, Toyama (JP); Nobuhiro Ichikawa, Toyama (JP); Yukako Nakamura, Toyama (JP)

(73) Assignee: YKK Corporation (JP)

(*) Notice: Subject to any disclaimer, the term of this patent is extended or adjusted under 35 U.S.C. 154(b) by 9 days.

(21) Appl. No.: 14/415,787

(22) PCT Filed: Jul. 24, 2012

(86) PCT No.: PCT/JP2012/068712
§ 371 (c)(1),
(2), (4) Date: Jan. 20, 2015

(87) PCT Pub. No.: WO2014/016908
PCT Pub. Date: Jan. 30, 2014

(65) Prior Publication Data
US 2015/0184277 A1   Jul. 2, 2015

(51) Int. Cl.
*A44B 19/24* (2006.01)
*C23C 14/00* (2006.01)
(Continued)

(52) U.S. Cl.
CPC .......... *C23C 14/0015* (2013.01); *A44B 19/12* (2013.01); *A44B 19/24* (2013.01); *C23C 14/083* (2013.01); *Y10T 24/2518* (2015.01)

(58) Field of Classification Search
CPC ..... A44B 19/12; A44B 19/24; C23C 14/0015; C23C 14/083; Y10T 24/2518
(Continued)

(56) References Cited

U.S. PATENT DOCUMENTS 3,768,125 A * 10/1973 Frohlich .............. A44B 19/406
                                                          24/396
4,456,663 A *  6/1984 Leonard .................... C23C 2/12
                                                          427/399

(Continued)

FOREIGN PATENT DOCUMENTS

JP         1-160502 A     6/1989
JP         3012/1992      1/1992
(Continued)

OTHER PUBLICATIONS

International Preliminary Report on Patentability, PCT Application No. PCT/JP2012/068712, mailed Feb. 5, 2015.
(Continued)

*Primary Examiner* — Robert J Sandy
*Assistant Examiner* — David Upchurch
(74) *Attorney, Agent, or Firm* — Kilpatrick Townsend & Stockton LLP

(57) ABSTRACT

A fastener element for slide fasteners where the color and pattern change diversely with viewing angle. A coiled fastener element for slide fasteners that is to be furnished on a fastener tape, wherein the fastener element is provided with an engagement head, an upper leg, a lower leg, and inverting part for connecting the upper leg with the lower leg; a coating comprising at least one light-transmissive layer is formed on at least the upper leg; and the thickness of the light-permeable layer is formed so as to decrease gradually from the approximate top of the upper leg to the fastener tape side and so that the layer thickness near the top is at most about 50-1500 nm.

20 Claims, 12 Drawing Sheets

(51) Int. Cl.
*A44B 19/12* (2006.01)
*C23C 14/08* (2006.01)

(58) Field of Classification Search
USPC .......................................................... 24/391
See application file for complete search history.

(56) References Cited

U.S. PATENT DOCUMENTS

| | | | | |
|---|---|---|---|---|
| 4,707,238 A | * | 11/1987 | Okubo | ................. A44C 27/006 |
| | | | | 204/192.38 |
| 4,922,585 A | * | 5/1990 | Suzuki | .................... A44B 19/34 |
| | | | | 24/381 |
| 4,937,922 A | | 7/1990 | Okazaki | |
| 5,035,029 A | * | 7/1991 | Horita | .................... A44B 19/02 |
| | | | | 24/394 |
| 5,607,621 A | * | 3/1997 | Ishihara | ................. C09K 11/02 |
| | | | | 252/301.36 |
| 5,956,818 A | | 9/1999 | Tsubata | |
| 2001/0004787 A1 | | 6/2001 | Nagata et al. | |
| 2002/0048684 A1 | * | 4/2002 | Sugimoto | ............ A44C 27/003 |
| | | | | 428/674 |
| 2008/0000064 A1 | * | 1/2008 | Chou | ...................... B21F 45/18 |
| | | | | 29/408 |
| 2011/0227487 A1 | * | 9/2011 | Nichol | ................. G02B 6/0018 |
| | | | | 315/158 |
| 2013/0314796 A1 | * | 11/2013 | Hitomi | ................. G02B 5/0866 |
| | | | | 359/599 |

FOREIGN PATENT DOCUMENTS

JP    11-155615 A    6/1999
JP    2001-178508 A    7/2001

OTHER PUBLICATIONS

International Search Report, PCT Application No. PCT/JP2012/068712, mailed Oct. 16, 2012.

* cited by examiner

Film thickness of layered dielectric substance film coated on coil element

Variation of film thickness depending on positions of dielectric substance film at coil element cross-section (Right panel represents schematic diagram of coating on coil element)

Lab colorimetric system (horizontal axis: red to green (a axis), vertical axis; yellow to blue (b axis))

Fig 9

| | Film thickness (about 500 nm) | Film thickness (more than about 1.5 μm) |
|---|---|---|
| Mag. ×20 | | |
| Mag. ×50 | | |

FASTENER ELEMENT FOR SLIDE FASTENERS

This application is a national stage application of PCT/JP2012/068712, which is incorporated herein by reference.

TECHNICAL FIELD

The present invention relates to a slide fastener. More specifically, the present invention relates to a decorated fastener element for slide fasteners (hereinafter, referred to as a fastener element) and a slide fastener comprising the element.

BACKGROUND ART

In recent years, decorativeness has been required for a slide fastener in addition to a function as a freely openable and closable fastener. To this end, pigment kneading, transfer and the like are performed as a method of decorating a resin fastener. Further, in order to add a more quality appearance to a fastener element, Japanese Patent Application Laid-Open No. 2001-178508 discloses a fastener element comprising a metal coating layer formed therein, wherein a phenomenon in which the metal coating layer is shaved off to scatter a metal powder around may be prevented by forming a coating on an upper surface except for an outer lateral surface of the fastener element which makes contact with a guide flange.

CITATION LIST

Patent Literature

[Patent Literature 1] Japanese Patent Application Laid-Open No. 2001-178508

SUMMARY OF THE INVENTION

Technical Problem

However, fastener elements obtained by the conventional technology have very simple appearance in terms of decorativeness, and a wide variety of colors and patterns can not be expressed using a coating. Further, in a case where a coating is formed in order to improve decorativeness according to the conventional technology, problems such as detachment and a crack of the coating have been encountered when used continuously.

An object of the present invention is to provide a fastener element in which colors and patterns are diversely changed depending on observing angles. Further, another object of the present invention is to provide a fastener element in which detachment and a crack of a decorative coating do not easily occur.

Solution to Problem

In order to achieve the above objects, the present invention provides a fastener element having the following features:

(1) A coil-like fastener element for slide fasteners to be attached to a fastener tape, wherein the fastener element comprises an engagement head, an upper leg, a lower leg and an inverting part connecting the upper leg and the lower leg, wherein a coating comprising at least one light transmissive layer is formed at least in the upper leg, wherein the layer thickness of the light transmissive layer is formed to gradually decrease from an approximate top of the upper leg toward the side of the fastener tape, and wherein the layer thickness of the approximate top is about 50 to about 1500 nm at the maximum (in some cases, about 50 to about 1500 nm at the maximum except for the film thickness of a resin (a resin top coating is not included)).

(2) The fastener element for slide fasteners according to (1), wherein an edge of the light transmissive layer is formed toward the side of the fastener tape beyond the central line in the horizontal direction of a cross-section of the upper leg.

(3) The fastener element for slide fasteners according to (1) or (2), wherein the light transmissive layer comprises at least two light transmissive layers laminated, and light is reflected on at least one interface formed with the at least two light transmissive layers.

(4) The fastener element for slide fasteners according to any one of (1) to (3), wherein the light transmissive layer is formed by layering three or more light transmissive layers so that the relative refractive indices of adjacent two layers are high/low in an alternate manner.

(5) The fastener element for slide fasteners according to any one of (1) to (4), wherein the light transmissive layer comprises a dielectric substance (for example, $TiO_2$, $Ta_2O_5$, $Nb_2O_5$, $ZrO_2$, $HfO_2$, $Sb_2O_3$, $CeO_2$, $ZnO$, $AlN$, $La_2O_3$, $Gd_2O_3$, $Al_2O_3$, $SiO_2$, $MgF_2$, $MgO$, $Si_3N_4$ and the like; materials are not necessarily in a stoichiometric proportion) as a material.

(6) The fastener element for slide fasteners according to any one of (1) to (5), wherein the light transmissive layer comprises an electrically conductive compound, a colored compound or a metal or semiconductor as a material.

(7) The fastener element for slide fasteners according to (6), wherein the layer thickness of a layer comprising the electrically conductive compound, the colored compound (ITO ($In_2O_3$:$SnO_2$ (5 to 10%)), $SnO_2$, $In_2O_3$, TiN, $Cr_2O_3$, TiC, ZrC, NbC, TaC and the like; materials are not necessarily in a stoichiometric proportion) or the metal or semiconductor as a material is 100 nm or less.

(8) The fastener element for slide fasteners according to any one of (1) to (7), wherein a layer comprising a resin (an acrylic silicon based resin, a methacrylic cured resin, a polyester.urethane based resin and the like) as a material is formed outside of the light transmissive layer.

(9) The fastener element for slide fasteners according to (8), wherein the layer comprising a resin as a material has a maximum film thickness of 500 nm or more, preferably 1 μm to 50 μm.

(10) The fastener element for slide fasteners according to any one of (1) to (9), wherein a layer comprising a metal (including a semiconductor) as a material (Au, Cu, Ag, Ni, Cr, Ti, Zr, Nb, Ta, Sn, Si and the like) is formed between the coating and the upper leg.

(11) The fastener element for slide fasteners according to (10), wherein the layer comprising a metal (including a semiconductor) as a material has a maximum layer thickness of 100 nm or less.

(12) A slide fastener comprising the fastener element according to any one of (1) to (11).

Advantageous Effect of Invention

In one aspect, the fastener element according to the present invention has a light transmissive thin film (layer) at a visually recognizable outer periphery portion of an upper leg, and therefore, is capable of forming an interference pattern. Then, in the fastener element according to the present invention, different interference patterns formed due to different film thicknesses can be obtained depending on observing angles since a film thickness (a layer thickness) is formed to gradually decrease. Moreover, since the film thickness is also in an appropriate range, a crack and the like do not easily occur.

In one aspect, the fastener element according to the present invention has a structure in which detachment of a coating does not easily occur since an edge in the outer periphery direction of the coating is formed toward the side of a fastener tape beyond the central line in the horizontal direction of a cross-section.

In one aspect, in the fastener element according to the present invention, an interface is formed by the coating comprising at least two light transmissive layers as laminated layers. Then, various color tones and complex interference patterns can be formed by reflected light from this interface. As a further specific example, since a layer having a high refractive index and a layer having a low refractive index are layered in an alternate manner, reflected light can be obtained from multiple interfaces, and thereby further complex interference patterns can be formed.

In one aspect, in the fastener element according to the present invention, at least one of the light transmissive layers is a colored layer, and thereby a specific color tone can be emphasized.

In one aspect, the fastener element according to the present invention has, as the outermost layer, a layer comprising a resin as a material, and thereby the surface durability can be improved.

In one aspect, in the fastener element according to the present invention, a layer having a metal as a material is formed as an underlying layer formed under a coating, and thereby a color tone due to interference of reflected light can be emphasized.

In one aspect, the slide fastener according to the present invention comprises the aforementioned fastener element, and thereby a color tone which can not be obtained by the conventional technology (a color tone changes depending on observing angles) can be obtained. Further, since semi-reflection is possible while an underlying color is seen, complex color tones can be conferred. It can be used for a glossy high quality garment such as silk, and can also be used for various coloring and pale textiles.

BRIEF DESCRIPTION OF THE DRAWINGS

FIG. 9 shows the occurrence of a crack depending on the film thicknesses of the fastener element according to one embodiment of the present invention.

DESCRIPTION OF EMBODIMENTS

Below, more specific embodiments of the present invention will be described.

<1. Configuration of Fastener>

Figure 1A:
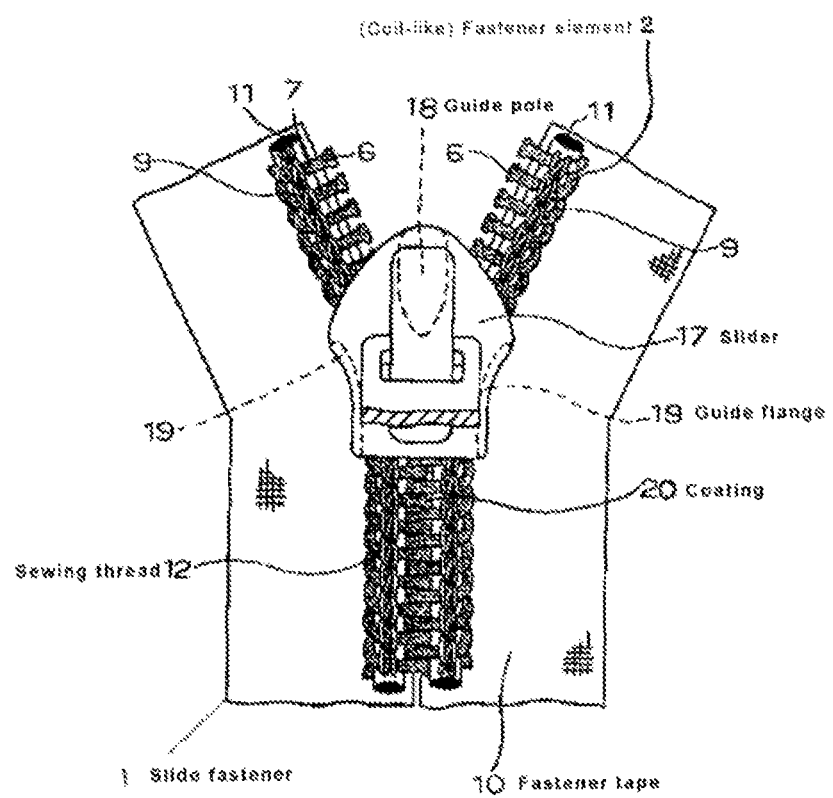
FIG. 1A shows a front view and FIG. 1B shows a side view of a slide fastener comprising the fastener element according to one embodiment of the present invention.
Figure 1B:
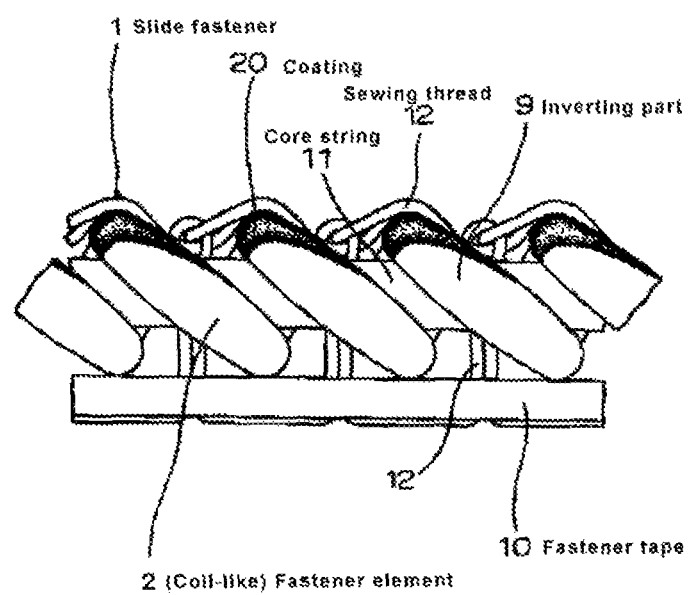

FIGS. 1A and 1B show an overall configuration of a slide fastener 1 including the fastener element of the present invention according to one embodiment. A coil-like fastener element 2 according to one embodiment of the present invention is sewn on a fastener tape 10 with a sewing thread 12. The fastener element 2 comprises an engagement head 6, and a pair of opposing engagement heads will engage by sliding a slider 17.

<2. Configuration of Fastener Element>

Figure 2:
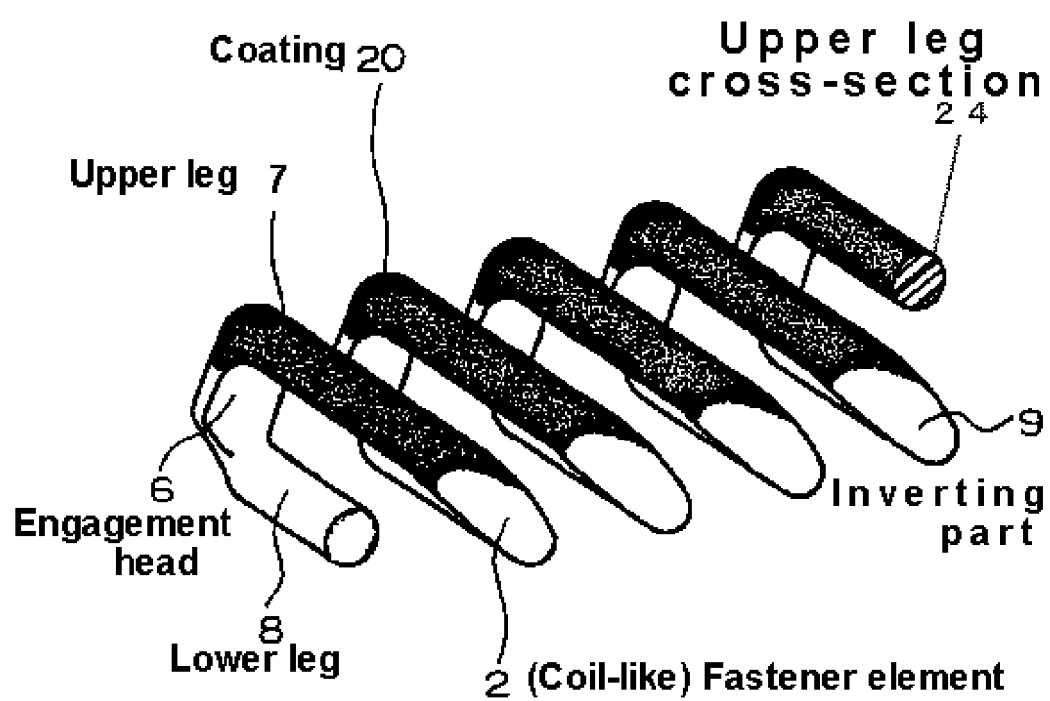
FIG. 2 shows an enlarged view of the fastener element according to one embodiment of the present invention.

FIG. 2 shows a configuration of the fastener element of the present invention according to one embodiment. For the fastener element 2, a monofilament 22 is wound in a coil-like fashion to form a coil-like fastener element 2. The coil-like fastener element 2 comprises the engagement head 6, an upper leg 7, a lower leg 8 and an inverting part 9 connecting the upper leg 7 and the lower leg 8. There is no particular limitation for the material of the fastener element, and for example, a resin (PET and the like) can be used. Further, the material of the fastener element may be colorless and transparent, or may be colored. As described below, it may also be coated with a metal layer as an underlayer.

<3. Configuration of Coating on Upper Leg>

Figure 3:
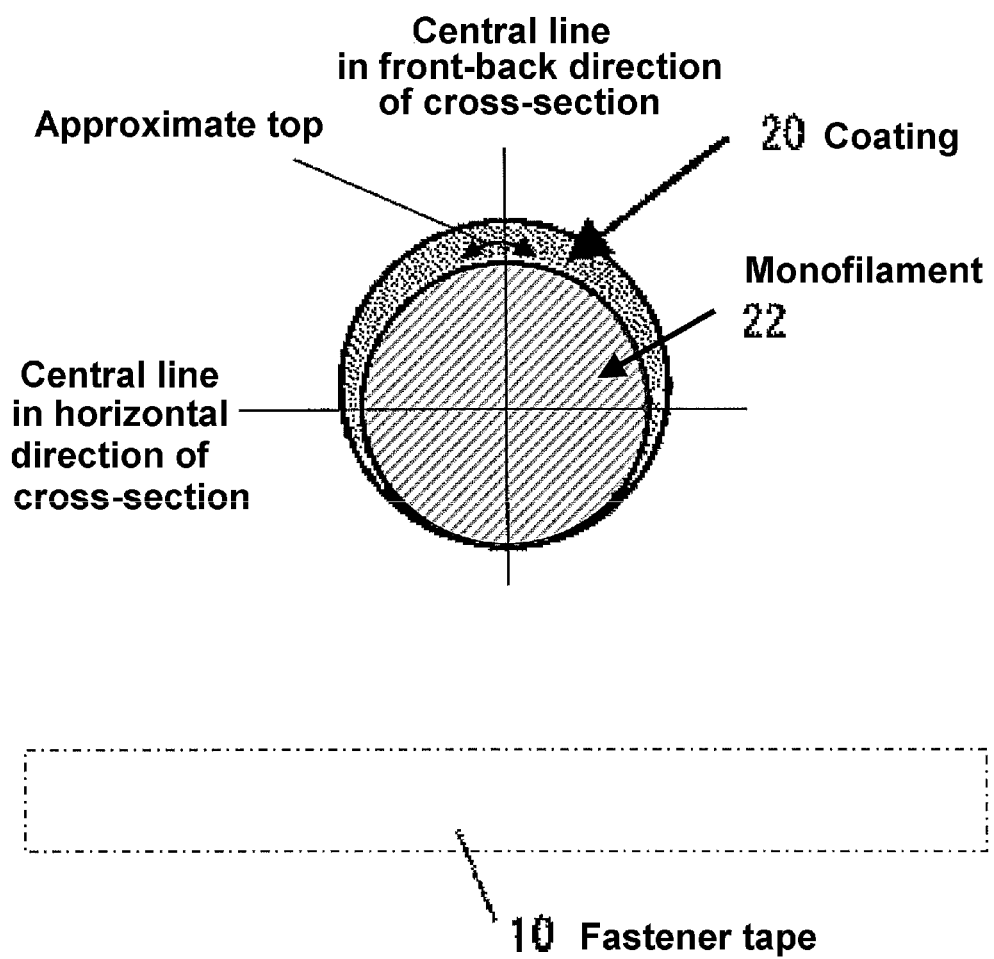
FIG. 3 shows a cross sectional view of an upper leg of the fastener element according to one embodiment of the present invention.

In one embodiment, as shown in FIG. 2 (24) and FIG. 3, a cross-sectional view of the upper leg has an approximately circular shape. In this case, the shape of the cross section is not necessarily a circular shape nor an approximately circle shape, and may be a shape such as an ellipse and a polygon (for example, a hexagon, an octagon, a dodecagon and the like).

A coating 20 can be formed on a portion visible to user's eyes within the coil-like fastener elements 2, i.e., the front side of the upper leg in order to add decorativeness. More specifically, the coating 20 is formed from an outer periphery portion of a cross-section of the upper leg which corresponds to an approximate top relative to the side of the fastener tape 10 along the outer periphery of the cross-section. The term "an approximate top" as used herein means a portion corresponding to the highest position with reference to the side of the fastener tape. Further, the term "the outer periphery portion of a cross-section" means a portion of the outer rim of a cross-sectional form cut across the monofilament 22. Moreover, the coating 20 is formed such that the film thickness of the coating gradually decreases when extending to the side of the fastener tape 10 (or the side of the lower leg 8) along the outer periphery.

In the embodiment described above, a portion at which the film thickness is the maximum typically corresponds to a portion at which the central line in the front-back direction of a cross-section in the radial direction of the monofilament intersects with the exterior outer periphery of the cross-section. The term "the central line in the front-back direction of a cross-section" as used herein means a line passing through the geometric center in a cross sectional view (for example, the intersection of diagonal lines, the center of gravity and the like), and extending perpendicular to the surface of the fastener tape. However, a position of the maximum film thickness is not necessarily located at the intersection, and an embodiment may be possible in which the peak of a film thickness may be located somewhat off from the intersection, and the film thickness starts to gradually decrease thereat. For example, when the central line in the front-back direction of a cross-section is taken as 0°, a position of the maximum film thickness may be located at an intersection between a line of −45° to 45° off or −30° to 30° off or −15° to 15° off and the exterior outer periphery of the cross-section.

In these embodiments described above, the coating comprises at least one light transmissive layer (typically, it comprises at least one light transmissive layer at the outmost portion within the coating). Further, the thickness of the light transmissive layer is about 50 to about 1500 nm, preferably about 200 to about 1500 nm, more preferably about 200 to about 800 nm and most preferably about 300 to about 500 nm at a portion of the maximum thickness (for example, a portion of the maximum thickness at the approximate top). Moreover, in a case where the layer thickness gradually decreases, there is no particular limitation for the thickness at an edge in the outer periphery direction of a light transmissive layer (that is, a portion at which the film thickness is minimum), but it is typically about 0 to about 80% when that of the maximum thickness portion is taken as 100%. Note that the abovementioned terms "the maximum thickness" and "the maximum layer thickness" mean a value obtained by sampling several positions corresponding to the aforementioned cross-section (for example, 10 positions), measuring each maximum layer thickness at each cross-section and computing a mean value.

An interference pattern is formed by providing a light transmissive layer having the thickness. Further, by providing a configuration in which the layer thickness gradually decreases, interference patterns can be obtained which change depending on observing angles. Light interference is less prone to occur when the maximum layer thickness is less than about 50 nm while a crack in a light transmissive layer and a coating is prone to occur when it is more than about 1500 nm.

In a further embodiment, when the coating 20 extends to the side of the fastener tape 10 along the outer periphery, an edge corresponding to an end may be formed toward the side of the fastener tape 10 beyond the central line in the horizontal direction of a cross-section of the upper leg. The term "the central line in the horizontal direction of a cross-section" as used herein means a line passing through the geometrical center of a cross-section in the radial direction of a monofilament (for example, an intersection of diagonal lines, the center of gravity and the like), and extending appropriately parallel to both the surface of the fastener tape and the cross-section. As described above, because the edge of the coating extends beyond the central line in the horizontal direction of a cross-section of the upper leg, the coating is structurally less prone to be detached.

<4. Material of Coating>

In one embodiment, any light transmissives material can be used as a material used for forming a coating (a light transmissive layer). For example, a dielectric substance, an electrically conductive compound, a colored compound, an ultra-thin metal (several nanometers to tens of nanometers), a semiconductor and the like can be used. Typically, it is a dielectric substance. Since a dielectric substance behaves as an insulator which does not conduct electricity, many of these show light transmittance. Plastics, ceramics, mica, oils and the like correspond to dielectric substances. Examples of a ceramic dielectric substance include the followings: For example, $TiO_2$, $Ta_2O_5$, $Nb_2O_5$, $ZrO_2$, $HfO_2$, $Sb_2O_3$, $CeO_2$, ZnO, AlN, $La_2O_3$, $Gd_2O_3$, $Al_2O_3$, $SiO_2$, $MgF_2$, MgO, $Si_3N_4$ and the like (note that materials may not be in a stoichiometric proportion). Examples of an electrically conductive compound and a colored compound include the followings: ITO ($In_2O_3$:$SnO_2$ (5 to 10%)), $SnO_2$, $In_2O_3$, TiN, $Cr_2O_3$, TiC, ZrC, NbC, TaC and the like (note that materials may not be in a stoichiometric proportion). Examples of a metal, a semiconductor and the like include the followings: Ag, Al, Au, Cr, Cu, Fe, Ni, Ni—Cr, Ti, Zr, Mo, Pt, Pd, Si and the like. Further, in a case where the materials are oxides or nitrides, the ratio thereof is not necessarily an integer ratio, but any ratios may be possible.

<5. Refractive Index of Material>

Moreover, in one embodiment, further diversity can be conferred on interference patterns by making proper use of a high refractive material and a low refractive material as light transmissive layers. For example, when trying to emphasize surface gloss, a layer in which a high refractive material is used is formed on a surface. On the other hand, when trying to emphasize the color of a base material and interference colors, a layer in which a low refractive material is used is formed on a surface. High refractive materials include, but not limited to, $TiO_2$ [refractive index: 2.2 to 2.5 (measurement wavelength: 0.55 μm)] (hereinafter, described in a similar way), $Ta_2O_5$ [2 to 2.3 (0.5 μm)], $Nb_2O_5$ [2.1 to 2.3 (0.5 μm)], $ZrO_2$ [2.05 (0.5 μm)], $HfO_2$ [1.93 (0.55 μm)], $Sb_2O_3$ [2.04 (0.55 μm)], $CeO_2$ [2.0 to 2.4 (0.55 μm)], ZnO [2 (0.55 μm)], MN [1.9 to 2.2 (0.63 μm)], $La_2O_3$ [1.95 (0.55 μm)], $Gd_2O_3$ [1.92 (0.55 μm)], $Si_3N_4$ [2.05 (0.55 μm)] and the like, and various mixed materials comprising the aforementioned materials and the like. Low refractive materials include, but not limited to, $Al_2O_3$ [1.63 (0.55 μm)], $SiO_2$ [1.45 to 1.47 (0.55 μm)], $MgF_2$ [1.38 (0.55 μm)], MgO [1.7 (0.5 μm)] and the like, and various mixed materials comprising the aforementioned materials and the like. Further, when specified by the refractive index, the refractive index of a layer of a high refractive material is typically 1.9 to 2.5, and the refractive index of a layer of a low refractive material is typically 1.38 to 1.72.

Moreover, in one embodiment, the coating comprises at least two light transmissive layers laminated. Then, light will be reflected on at least one interface formed by the at least two light transmissive layers. This reflected light causes interference with a reflected light from the coating surface and a reflected light from the interface between the coating and the upper leg, and interference patterns more complex than those in a case where the number of light transmissive layer is one can be formed.

Further, in one embodiment, the coating may be formed by layering three or more light transmissive layers, and may be formed by layering a layer having a high refractive index and a layer having a low refractive index in an alternate manner. Note that a high refractive index, a low refractive index as described herein do not mean that they fall in a specific numerical range of the refractive index, but are defined by the relative relationship with the refractive index of an adjacent layer. In this embodiment, the coating may be, for example, a S-layer film such as $TiO_2$/$SiO_2$/$TiO_2$, $SiO_2$/$TiO_2$/$SiO_2$, or may be a multilayer film such as $[SiO_2$/$TiO_2]_n$ (11=1, 2, 3 . . . ). In the case of these multilayer structures, patterns in which a reflected light from each surface is interfered in a further complex manner can be formed. Note that even in a case where the coating comprises at least two light transmissive layers, the film thickness of the coating is preferably in the range described above. Further, the term "alternate" as used herein does not mean strictly repeated patterns such as high/low/high/low and so on in terms of the refractive index, but a continuous sequence of lays having a high refractive index or a low refractive index, for example, a sequence of high/high/low/high/low/low and so on is acceptable as long as the effects of the present invention can be achieved.

<6. Other Layer Structures>

In one embodiment, at least one light transmissive layer in the coating may be a colored layer. Typically, in a case where the coating comprises two or more layers, at least one light transmissive layer present between layers may be a colored layer. Alternatively, at least one light transmissive layer present between any layer and a monofilament may be typically a colored layer. Note that the term "colored" means that it is colored by a color other than white. Materials for the colored layer include, for example, a colored compound and a metal. A specific color tone can be emphasized by providing a film using these as a material. A film using these as a material preferably has a low level so as to transmit light. A typical thickness is about 100 nm or less, preferably about 5 to 50 nm at the maximum film thickness. Colored compounds include, for example, TiN, $Cr_2O_3$, TiC, ZrC, NbC, TaC and the like. The metal materials include Au, Cu, Ag, Ni, Cr, Ti, Zr, Nb, Ta, Sn, Si and the like.

Further, in one embodiment, in order to increase the surface durability, a layer using a hard film, a resin and the like as a material may be provided as the outermost layer (a top coating). Specific materials include a hard film such as $SiNi_4$, $SiO_2$, SiC, or an acrylic silicon resin system, a methacrylic cured resin, a polyester urethane based resin and the like. Typically, the film thickness of an outermost layer using a hard film as a material is about 200 nm or more, preferably about 200 nm to about 500 nm at the maximum film thickness. Further, typically, the film thickness of an outermost layer using a soft film such as a resin as a material is about 500 nm or more, preferably about 1 μm to about 50 μm at the maximum film thickness.

Moreover, in one embodiment, an underlying layer can be provided between the coating and the upper leg. A color tone due to interference of reflected light can be emphasized by forming, as an underlying layer, a layer using a metal (including a semiconductor) such as Au, Cu, Ag, Ni, Cr, Ti, Zr, Nb, Ta, Sn, Si as a material. Alternatively, a metal such as Si, Ti, Zr, or oxides or nitrides thereof may be used as a material. Adherence can be increased by using such a layer. The underlying layer has a maximum layer thickness of 500 nm or less, preferably 100 nm or less.

<7. Manufacturing Method>

A coil-like fastener element prepared by winding a synthetic resin monofilament (for example, PET, POM and the like) into a coil-like shape can be used as a material. An operation for forming a coating is performed to an exposed portion of an upper leg of a fastener element. After forming a coating, the fastener element is sewn on a fastener tape to serve as a slide fastener. Further, meanwhile, after sewing the fastener element on the fastener tape, portions other than the upper leg of the fastener element may be masked, and then a coating may be formed. In order to form a coating, a desired dry metal plating method can be used such as vacuum vapor deposition, ion plating, sputtering, chemical vapor deposition. Typically, a coating is formed by using sputtering. When forming a top coating of a dielectric layer as well as a colored compound layer, a metal film and a hard film which are other layers, deposition may be performed by an approach of dry plating (sputtering, vapor deposition, ion plating and the like), and a soft resin top coating can be deposited by the conventional spraying and dipping methods instead of an approach of dry plating.

Moreover, a desired coating can be formed by simply depositing from the front-back direction of a fastener element in order to form a film having a gradually decreasing film thickness. For example, in a case where a cross-section of a monofilament is in an approximate circular shape, as shown in FIG. 3, a film in which the film thickness is smoothly decreasing can be formed by performing deposition from a direction along the central line in the front-back direction of the cross-section.

EXAMPLES

1. Manufacturing Method

Targets comprising materials listed in the tables shown below were prepared. A target size was 10 inches×3 inches. In some cases, a coating was coated using dual targets in order to form layers having different materials in an alternate manner.

The above sputtering target(s) was mounted on a dual magnetron sputtering device from Kawai Optics Co., Ltd. (Model RDS700), and deposition was performed using an element of a material listed in the tables as a substrate under the following conditions: a sputtering gas pressure ($Ar+O_2$) of 0.5 Pa, a space between the target and the substrate of 100 mm, a deposition temperature of the room temperature to 70° C., and a sputtering power of 4.0 kW. Deposition time was adjusted according to an intended film thickness.

2. Method of Measuring Film Thickness

Figure 4:
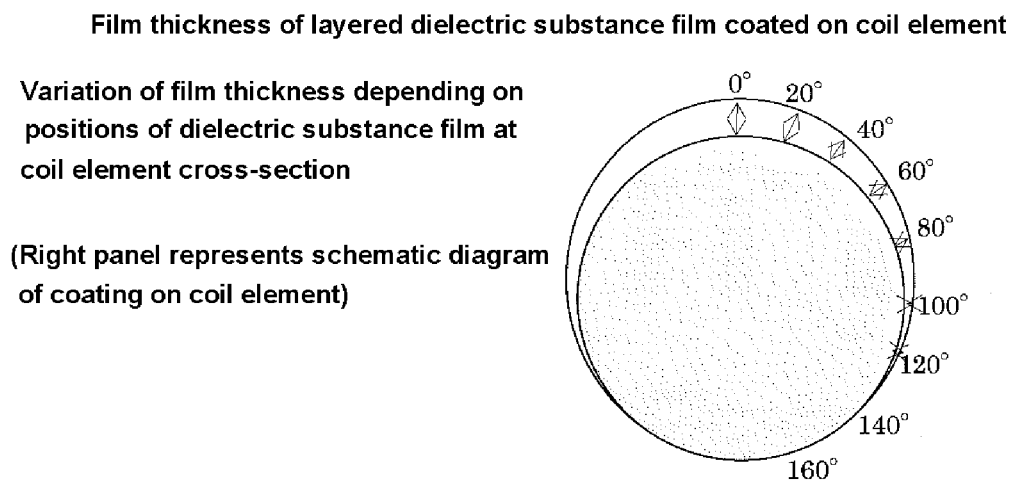
FIG. 4 shows variations in a film thickness of a coating formed on a monofilament of the fastener element according to one embodiment of the present invention and a measurement method thereof.

The film thickness of a coating was measured by observing a cross-section of a monofilament with FE-SEM (Hitachi, Ltd., S-4800). For the cross-section of the monofilament used for observation, the monofilament was embedded in a resin, and treated with polishing and a CP (cross-section polisher). Specifically, as shown in FIG. 4, for an approximate circular cross-section, each position at the outer periphery was specified in every 20° from 0° to 160°, and a film thickness at each position was measured. The cross-section was sampled at ten positions, and measurements were performed for each angle at each cross-section.

3. Method of Measuring Tone Change

Figure 5A:
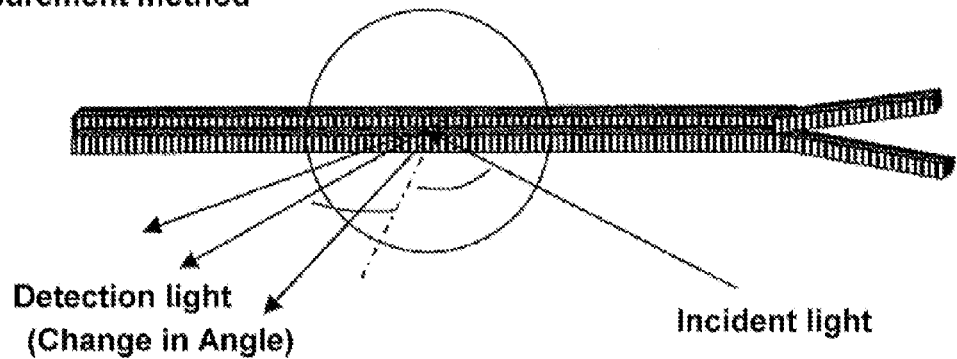
FIGS. 5A-5C show a method of observing a color tone change of the fastener element according to one embodiment of the present invention.
Figure 5B:
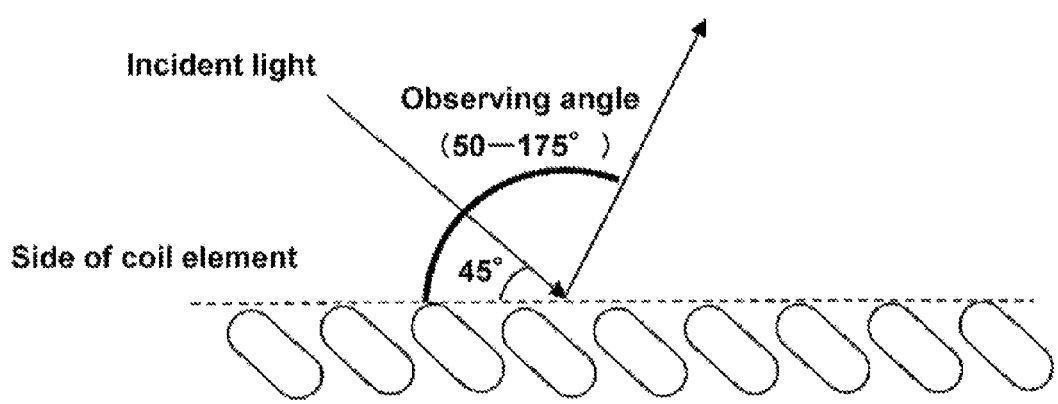
Figure 5C:
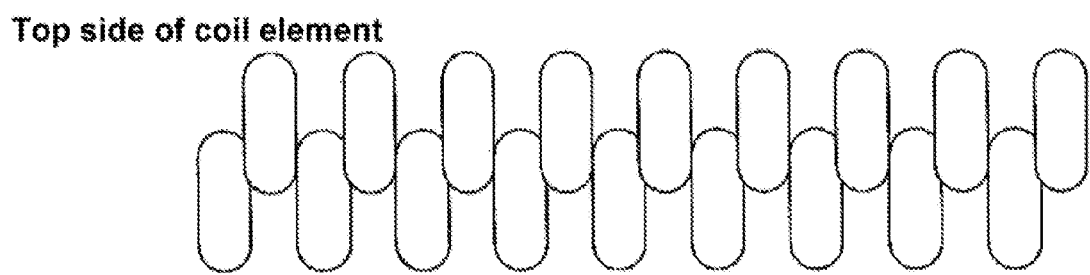

In order to investigate a tone change depending on observing angles, a variable angle spectrophotometer, i.e., a combination of an ultraviolet visible infrared spectrophotometer+an automated absolute reflectance measurement unit (Jasco Corporation, V-670+ARMN735) was used. As shown in FIG. 5A, the difference in detection light (the whole region of visible light wavelengths (specific wavelengths)) depending on angles was measured by giving incident light to a sample (a fastener element) while rotating a detector. Unless otherwise stated, the incident light was at 45° in any Example. As shown in FIG. 5B, the angle of incident light and the observing angle (the position of a detector) were defined with reference to the tangential line at the upper part of an upper leg (0°) when a coil element was seen from the side. The obtained detection light (wavelength distribution) data (spectral distribution, tristimulus values) were transformed into data in the xyz chromaticity and further into data in the CIEL*a*b* color system if needed.

Example 1

Coatings were formed into configurations described in Table 1 below. Then, using the aforementioned method, the difference in detection light depending on observing angles was measured, and transformed into data of the value a and the value b in the L*a*b* color system.

TABLE 1

1) Monolayer coating

| Layer | Material | Refractive index | Angle (°) | Film thickness (nm) |
|---|---|---|---|---|
| Substrate | PET* | 1.64 | | |
| 1 | $Nb_2O_5$ | 2.25 | 0 | 170 |
| | $Nb_2O_5$ | 2.25 | 20 | 135 |
| | $Nb_2O_5$ | 2.25 | 40 | 80 |
| | $Nb_2O_5$ | 2.25 | 60 | 40 |
| | $Nb_2O_5$ | 2.25 | 80 | 12 |
| | $Nb_2O_5$ | 2.25 | 100 | 3 |
| | | | 120 | 0 |
| | | | 140 | 0 |
| | | | 160 | 0 |
| | | | 180 | 0 |

*PET (polyethylene terephthalate)

Figure 6:
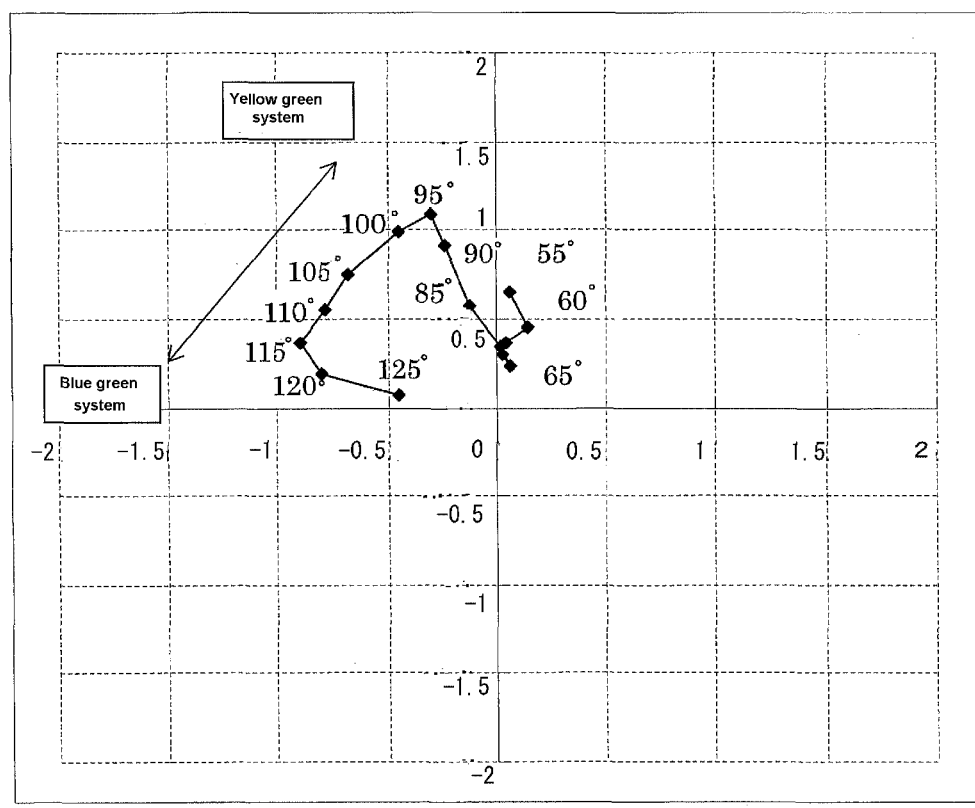
FIG. 6 shows a color tone change of the fastener element according to one embodiment of the present invention.

As shown in FIG. 6, changes in the color system to the yellow green system, the blue green system and the like were observed depending on observing angles.

Example 2

Coatings were formed into configurations described in Table 2 below. Further, the fastener described in Japanese Patent Application Laid-Open No. 2001-178508 was prepared as a material for comparison. Then, the difference in detection light (red, green, blue) depending on observing angles was measured using the aforementioned method. Specifically, white light (the intensity of light at each wavelength of a light source covering the whole range of visible light wavelengths was taken as 100%) was incidented, and the intensity ratio of the reflected light to the incident light at each wavelength was detected. The obtained intensity at each wavelength (spectrum) was converted into color.

TABLE 2

1) Fastener of the present invention (Green color system)

| Layer | Material | Refractive index | Maximum film thickness (nm) |
|---|---|---|---|
| Substrate | PET | 1.64 | |
| 1 | $Nb_2O_5$ | 2.25 | 90 |
| 2 | $SiO_2$ | 1.45 | 10 |
| 3 | $Nb_2O_5$ | 2.25 | 40 |
| 4 | $SiO_2$ | 1.45 | 90 |
| 5 | $Nb_2O_5$ | 2.25 | 100 |
| 6 | $SiO_2$ | 1.45 | 10 |
| 7 | $Nb_2O_5$ | 2.25 | 30 |
| Total film thickness (0°) | | | 370 |
| Total film thickness (20°) | | | 290 |
| Total film thickness (40°) | | | 210 |
| Total film thickness (60°) | | | 130 |
| Total film thickness (80°) | | | 110 |
| Total film thickness (100°) | | | 80 |

TABLE 2-continued

1) Fastener of the present invention (Green color system)

| Layer | Material | Refractive index | Maximum film thickness (nm) |
|---|---|---|---|
| Total film thickness (120°) | | | 40 |
| Total film thickness (140°) | | | 0 |
| Total film thickness (160°) | | | 0 |

Figure 7:
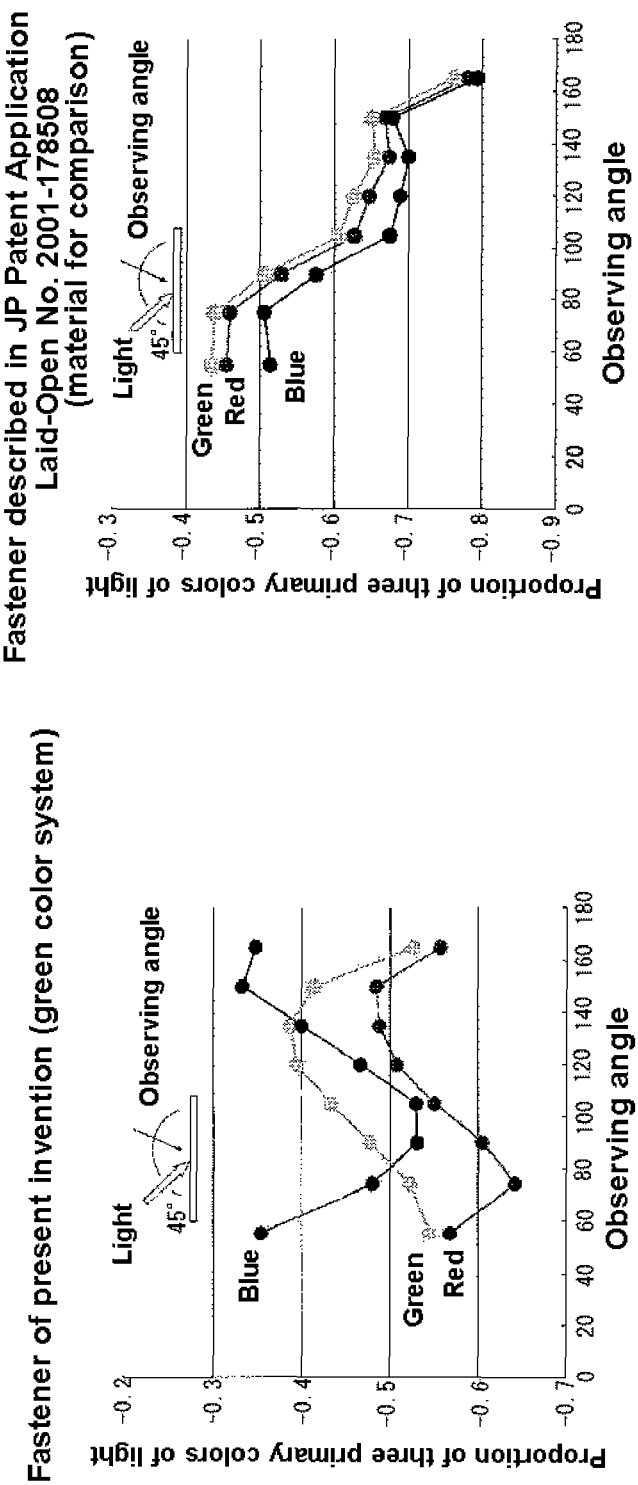
FIG. 7 shows a color tone change of the fastener element according to one embodiment of the present invention.

As shown in FIG. 7, for the fastener of the present invention (an interference color fastener), changes in intensity were observed in the three primary colors of red, green, blue depending on observing angles. In contract, for the fastener described in Japanese Patent Application Laid-Open No. 2001-178508 (Metallion), changes in intensity were not observed even when an observing angle was changed since the coating formed was not of a light transmissive material.

Example 3

Coatings were formed into configurations described in Tables 3 below. Then, using the aforementioned method, the difference in detection light at each wavelength was measured with an incident light of 85° and an observing angle of 95°.

TABLE 3-1

Red color system interference film

| Layer | Material | Refractive index | Film thickness at 0° (nm) |
|---|---|---|---|
| 1) 8-layer coating | | | |
| Substrate | PET | 1.64 | |
| 1 | $Nb_2O_5$ | 2.25 | 105 |
| 2 | $SiO_2$ | 1.45 | 44 |
| 3 | $Nb_2O_5$ | 2.25 | 111 |
| 4 | $SiO_2$ | 1.45 | 116 |
| 5 | $Nb_2O_5$ | 2.25 | 19 |
| 6 | $SiO_2$ | 1.45 | 164 |
| 7 | $Nb_2O_5$ | 2.25 | 87 |
| 8 | $SiO_2$ | 1.45 | 210 |
| Total film thickness at each angle (nm) | | | |
| Total film thickness (0°) | | | 856 |
| Total film thickness (20°) | | | 650 |
| Total film thickness (40°) | | | 500 |
| Total film thickness (60°) | | | 320 |
| Total film thickness (80°) | | | 250 |
| Total film thickness (100°) | | | 160 |
| Total film thickness (120°) | | | 60 |
| Total film thickness (140°) | | | 0 |
| Total film thickness (160°) | | | 0 |
| 2) 6-layer coating | | | |
| Substrate | PET | 1.64 | |
| 1 | $Nb_2O_5$ | 2.25 | 102 |
| 2 | $SiO_2$ | 1.45 | 100 |
| 3 | $Nb_2O_5$ | 2.25 | 22 |
| 4 | $SiO_2$ | 1.45 | 172 |
| 5 | $Nb_2O_5$ | 2.25 | 92 |
| 6 | $SiO_2$ | 1.45 | 235 |
| Total film thickness at each angle (nm) | | | |
| Total film thickness (0°) | | | 723 |
| Total film thickness (20°) | | | 550 |
| Total film thickness (40°) | | | 435 |
| Total film thickness (60°) | | | 285 |
| Total film thickness (80°) | | | 223 |
| Total film thickness (100°) | | | 155 |
| Total film thickness (120°) | | | 60 |

TABLE 3-1-continued

Red color system interference film

| Layer | Material | Refractive index | Film thickness at 0° (nm) |
|---|---|---|---|
| Total film thickness (140°) | | | 0 |
| Total film thickness (160°) | | | 0 |

TABLE 3-2

Red color system interference film

3) 4-layer coating

| Layer | Material | Refractive index | Film thickness at 0° (nm) |
|---|---|---|---|
| Substrate | PET | 1.64 | |
| 1 | Nb$_2$O$_5$ | 2.25 | 54 |
| 2 | SiO$_2$ | 1.45 | 129 |
| 3 | Nb$_2$O$_5$ | 2.25 | 91 |
| 4 | SiO$_2$ | 1.45 | 188 |

Total film thickness at each angle (nm)

| | |
|---|---|
| Total film thickness (0°) | 462 |
| Total film thickness (20°) | 350 |
| Total film thickness (40°) | 270 |
| Total film thickness (60°) | 170 |
| Total film thickness (80°) | 130 |
| Total film thickness (100°) | 80 |
| Total film thickness (120°) | 30 |
| Total film thickness (140°) | 0 |
| Total film thickness (160°) | 0 |

4) 2-layer coating

| Layer | Material | Refractive index | Film thickness at 0° (nm) |
|---|---|---|---|
| Substrate | PET | 1.64 | |
| 1 | Nb$_2$O$_5$ | 2.25 | 98 |
| 2 | SiO$_2$ | 1.45 | 240 |

Total film thickness at each angle (nm)

| | |
|---|---|
| Total film thickness (0°) | 338 |
| Total film thickness (20°) | 250 |
| Total film thickness (40°) | 250 |
| Total film thickness (60°) | 200 |
| Total film thickness (80°) | 125 |
| Total film thickness (100°) | 100 |
| Total film thickness (120°) | 65 |
| Total film thickness (140°) | 25 |
| Total film thickness (160°) | 0 |

TABLE 3-3

Green color system interference film

1) 8-layer coating

| Layer | Material | Refractive index | Film thickness at 0° (nm) |
|---|---|---|---|
| Substrate | PET | 1.64 | |
| 1 | Nb$_2$O$_5$ | 2.25 | 35 |
| 2 | SiO$_2$ | 1.45 | 12 |
| 3 | Nb$_2$O$_5$ | 2.25 | 12 |
| 4 | SiO$_2$ | 1.45 | 107 |
| 5 | Nb$_2$O$_5$ | 2.25 | 48 |
| 6 | SiO$_2$ | 1.45 | 12 |
| 7 | Nb$_2$O$_5$ | 2.25 | 108 |
| 8 | SiO$_2$ | 1.45 | 166 |

TABLE 3-3-continued

Green color system interference film

Total film thickness at each angle (nm)

| | |
|---|---|
| Total film thickness (0°) | 500 |
| Total film thickness (20°) | 375 |
| Total film thickness (40°) | 300 |
| Total film thickness (60°) | 200 |
| Total film thickness (80°) | 160 |
| Total film thickness (100°) | 120 |
| Total film thickness (120°) | 50 |
| Total film thickness (140°) | 0 |
| Total film thickness (160°) | 0 |

2) 6-layer coating

| Layer | Material | Refractive index | Film thickness at 0° (nm) |
|---|---|---|---|
| Substrate | PET | 1.64 | |
| 1 | Nb$_2$O$_5$ | 2.25 | 38 |
| 2 | SiO$_2$ | 1.45 | 12 |
| 3 | Nb$_2$O$_5$ | 2.25 | 13 |
| 4 | SiO$_2$ | 1.45 | 112 |
| 5 | Nb$_2$O$_5$ | 2.25 | 50 |
| 6 | SiO$_2$ | 1.45 | 173 |

Total film thickness at each angle (nm)

| | |
|---|---|
| Total film thickness (0°) | 398 |
| Total film thickness (20°) | 300 |
| Total film thickness (40°) | 240 |
| Total film thickness (60°) | 160 |
| Total film thickness (80°) | 125 |
| Total film thickness (100°) | 81 |
| Total film thickness (120°) | 35 |
| Total film thickness (140°) | 0 |
| Total film thickness (160°) | 0 |

TABLE 3-4

Green color system interference film

3) 4-layer coating

| Layer | Material | Refractive index | Film thickness at 0° (nm) |
|---|---|---|---|
| Substrate | PET | 1.64 | |
| 1 | Nb2O5 | 2.25 | 10 |
| 2 | SiO2 | 1.45 | 132 |
| 3 | Nb2O5 | 2.25 | 55 |
| 4 | SiO2 | 1.45 | 197 |

Total film thickness at each angle (nm)

| | |
|---|---|
| Total film thickness (0°) | 394 |
| Total film thickness (20°) | 300 |
| Total film thickness (40°) | 229 |
| Total film thickness (60°) | 150 |
| Total film thickness (80°) | 120 |
| Total film thickness (100°) | 80 |
| Total film thickness (120°) | 30 |
| Total film thickness (140°) | 0 |
| Total film thickness (160°) | 0 |

4) 6-layer coating (Total film thickness: large)

| Layer | Material | Refractive index | Film thickness at 0° (nm) |
|---|---|---|---|
| Substrate | PET | 1.64 | |
| 1 | Nb2O5 | 2.25 | 40 |
| 2 | SiO2 | 1.45 | 154 |
| 3 | Nb2O5 | 2.25 | 131 |
| 4 | SiO2 | 1.45 | 120 |
| 5 | Nb2O5 | 2.25 | 54 |
| 6 | SiO2 | 1.45 | 185 |

TABLE 3-4-continued

Green color system interference film

Total film thickness at each angle (nm)

| | |
|---|---|
| Total film thickness (0°) | 684 |
| Total film thickness (20°) | 510 |
| Total film thickness (40°) | 412 |
| Total film thickness (60°) | 257 |
| Total film thickness (80°) | 203 |
| Total film thickness (100°) | 129 |
| Total film thickness (120°) | 60 |
| Total film thickness (140°) | 0 |
| Total film thickness (160°) | 0 |

TABLE 3-5

Blue color system interference film 1) 8-layer coating

| Layer | Material | Refractive index | Film thickness at 0° (nm) |
|---|---|---|---|
| Substrate | PET | 1.64 | |
| 1 | $Nb_2O_5$ | 2.25 | 21 |
| 2 | $SiO_2$ | 1.45 | 102 |
| 3 | $Nb_2O_5$ | 2.25 | 20 |
| 4 | $SiO_2$ | 1.45 | 102 |
| 5 | $Nb_2O_5$ | 2.25 | 20 |
| 6 | $SiO_2$ | 1.45 | 102 |
| 7 | $Nb_2O_5$ | 2.25 | 20 |
| 8 | $SiO_2$ | 1.45 | 102 |

Total film thickness at each angle (nm)

| | |
|---|---|
| Total film thickness (0°) | 489 |
| Total film thickness (20°) | 375 |
| Total film thickness (40°) | 290 |
| Total film thickness (60°) | 190 |
| Total film thickness (80°) | 150 |
| Total film thickness (100°) | 100 |
| Total film thickness (120°) | 40 |
| Total film thickness (140°) | 0 |
| Total film thickness (160°) | 0 |

2) 6-layer coating

| Layer | Material | Refractive index | Film thickness at 0° (nm) |
|---|---|---|---|
| Substrate | PET | 1.64 | |
| 1 | $Nb_2O_5$ | 2.25 | 19 |
| 2 | $SiO_2$ | 1.45 | 90 |
| 3 | $Nb_2O_5$ | 2.25 | 19 |
| 4 | $SiO_2$ | 1.45 | 90 |
| 5 | $Nb_2O_5$ | 2.25 | 19 |
| 6 | $SiO_2$ | 1.45 | 90 |

Total film thickness at each angle (nm)

| | |
|---|---|
| Total film thickness (0°) | 327 |
| Total film thickness (20°) | 250 |
| Total film thickness (40°) | 200 |
| Total film thickness (60°) | 120 |
| Total film thickness (80°) | 95 |
| Total film thickness (100°) | 70 |
| Total film thickness (120°) | 30 |
| Total film thickness (140°) | 0 |
| Total film thickness (160°) | 0 |

TABLE 3-6

Blue color system interference film 3) 4-layer coating

| Layer | Material | Refractive index | Film thickness at 0° (nm) |
|---|---|---|---|
| Substrate | PET | 1.64 | |
| 1 | $Nb_2O_5$ | 2.25 | 31 |
| 2 | $SiO_2$ | 1.45 | 92 |
| 3 | $Nb_2O_5$ | 2.25 | 31 |
| 4 | $SiO_2$ | 1.45 | 158 |

TABLE 3-6-continued

Blue color system interference film

Total film thickness at each angle (nm)

| | |
|---|---|
| Total film thickness (0°) | 312 |
| Total film thickness (20°) | 238 |
| Total film thickness (40°) | 185 |
| Total film thickness (60°) | 122 |
| Total film thickness (80°) | 95 |
| Total film thickness (100°) | 65 |
| Total film thickness (120°) | 30 |
| Total film thickness (140°) | 0 |
| Total film thickness (160°) | 0 |

4) 2-layer coating

| Layer | Material | Refractive index | Film thickness at 0° (nm) |
|---|---|---|---|
| Substrate | PET | 1.64 | |
| 1 | $Nb_2O_5$ | 2.25 | 30 |
| 2 | $SiO_2$ | 1.45 | 157 |

Total film thickness at each angle (nm)

| | |
|---|---|
| Total film thickness (0°) | 187 |
| Total film thickness (20°) | 143 |
| Total film thickness (40°) | 110 |
| Total film thickness (60°) | 70 |
| Total film thickness (80°) | 60 |
| Total film thickness (100°) | 40 |
| Total film thickness (120°) | 20 |
| Total film thickness (140°) | 0 |
| Total film thickness (160°) | 0 |

Figure 8:
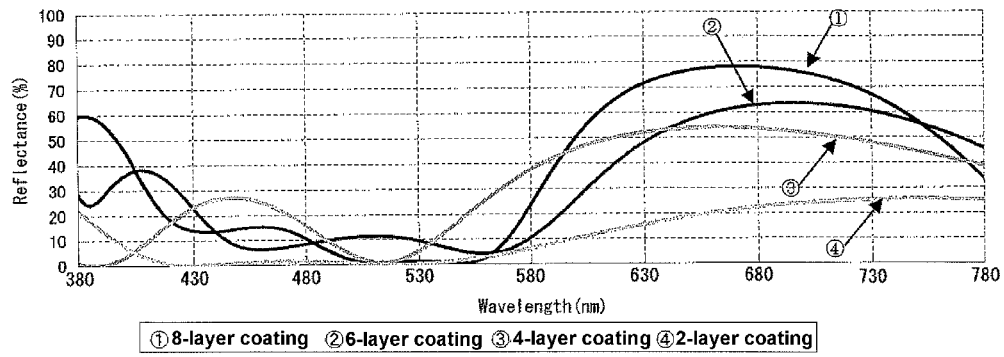
FIG. 8 shows a color tone change depending on the number of layers and film thicknesses of the fastener element according to one embodiment of the present invention.
Figure 8:
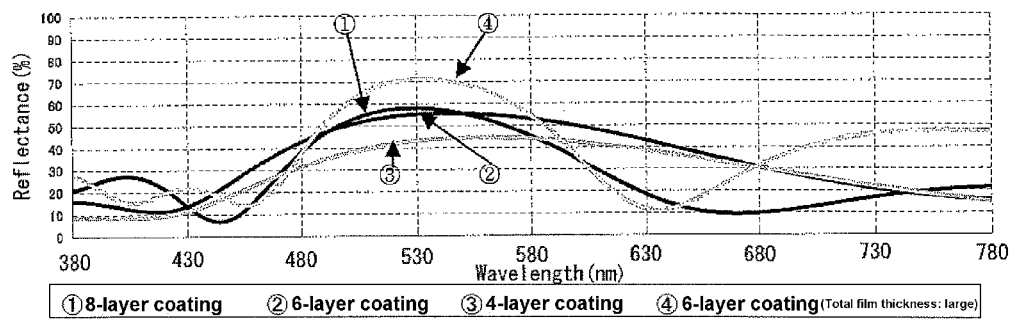
Figure 8:
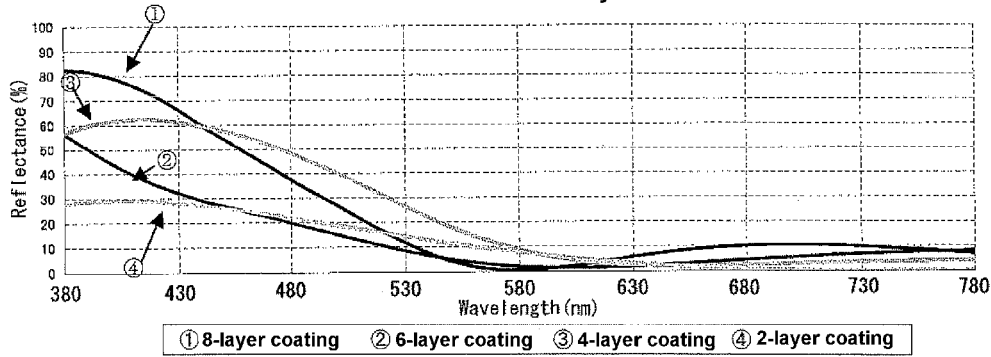

As shown in FIG. 8, even in a case where interference patterns of the same color system was formed, the intensity of reflected light was allowed to be changed depending on the thickness of each layer and the number of layers. For example, for the green color system interference films, there is one case in which the number of layers was the same (6 layers), but the film thicknesses were different. The intensity difference of reflected light was observed in the case. Further, similarly, for the green color system interference films, there are two cases in which the number of layers differs (4 layers and 6 layers), but the film thicknesses were substantially the same (about 398 nm and about 394 nm). The intensity difference of reflected light was also observed in these cases. As described above, it was demonstrated that further diversity can be conferred on interference patterns by changing the number of layers and film thicknesses.

Example 4

Fastener elements with two film thicknesses (about 500 nm and more than about 1.5 μm) were prepared into film configurations described in the table below. After bending a coil element 10 times (bended by 180° to −180°), a cellophane tape was stuck on the both samples, and stroked, and then removed. Subsequently, a crack in the coating and the degree of detachment were compared. As indicated as the circles in FIG. 9, in the case of the coil element having a maximum film thickness of more than about 1.5 μm, a crack and detachment were observed, and the film was found to be lost.

TABLE 4-1

1) Coating with a film thickness of 500 nm, green color system 8-layer

| Layer | Material | Refractive index | Film thickness at 0° (nm) |
|---|---|---|---|
| Substrate | PET | 1.64 | |
| 1 | $Nb_2O_5$ | 2.25 | 35 |
| 2 | $SiO_2$ | 1.45 | 12 |
| 3 | $Nb_2O_5$ | 2.25 | 12 |
| 4 | $SiO_2$ | 1.45 | 107 |
| 5 | $Nb_2O_5$ | 2.25 | 48 |
| 6 | $SiO_2$ | 1.45 | 12 |
| 7 | $Nb_2O_5$ | 2.25 | 108 |
| 8 | $SiO_2$ | 1.45 | 166 |

Total film thickness at each angle (nm)

| | |
|---|---|
| Total film thickness (0°) | 500 |
| Total film thickness (20°) | 375 |
| Total film thickness (40°) | 300 |
| Total film thickness (60°) | 200 |
| Total film thickness (80°) | 160 |
| Total film thickness (100°) | 120 |
| Total film thickness (120°) | 50 |
| Total film thickness (140°) | 0 |
| Total film thickness (160°) | 0 |

TABLE 4-2

2) Coating with a film thickness of more than 1500 nm

| Layer | Material | Refractive index | Film thickness at 0° (nm) |
|---|---|---|---|
| Substrate | PET | 1.64 | |
| 1 | $Nb_2O_5$ | 2.25 | 80 |
| 2 | $SiO_2$ | 1.45 | 125 |
| 3 | $Nb_2O_5$ | 2.25 | 80 |
| 4 | $SiO_2$ | 1.45 | 125 |
| 5 | $Nb_2O_5$ | 2.25 | 80 |
| 6 | $SiO_2$ | 1.45 | 125 |
| 7 | $Nb_2O_5$ | 2.25 | 80 |
| 8 | $SiO_2$ | 1.45 | 125 |
| 9 | $Nb_2O_5$ | 2.25 | 80 |
| 10 | $SiO_2$ | 1.45 | 125 |
| 11 | $Nb_2O_5$ | 2.25 | 80 |
| 12 | $SiO_2$ | 1.45 | 125 |
| 13 | $Nb_2O_5$ | 2.25 | 80 |
| 14 | $SiO_2$ | 1.45 | 125 |
| 15 | $Nb_2O_5$ | 2.25 | 80 |
| 16 | $SiO_2$ | 1.45 | 125 |

Total film thickness at each angle (nm)

| | |
|---|---|
| Total film thickness (0°) | 1640 |
| Total film thickness (20°) | 1250 |
| Total film thickness (40°) | 980 |
| Total film thickness (60°) | 650 |
| Total film thickness (80°) | 500 |
| Total film thickness (100°) | 320 |
| Total film thickness (120°) | 130 |
| Total film thickness (140°) | 50 |
| Total film thickness (160°) | 0 |

REFERENCE SIGNS LIST

1 Slide fastener
2 (Coil-like) Fastener element
6 Engagement head
7 Upper leg
8 Lower leg
9 Inverting part
10 Fastener tape
11 Core string
12 Sewing thread
17 Slider 18 Guide pole
19 Guide flange
20 Coating
22 Monofilament
24 Upper leg cross-section

The invention claimed is:

1. A coil-shaped fastener element for slide fasteners to be attached to a fastener tape,
wherein the fastener element comprises an engagement head, an upper leg, a lower leg and an inverting part connecting the upper leg and the lower leg,
wherein a coating comprising at least one light transmissive layer is formed at least in the upper leg,
wherein a layer thickness of the light transmissive layer is formed to gradually decrease from an approximate top of the upper leg toward a side of the fastener tape,
wherein the layer thickness of the approximate top is about 50 nanometer (nm) to about 1500 nm at the maximum, and
wherein the light transmissive layer comprises at least two light transmissive layers laminated, and light is reflected on at least one interface formed with the at least two light transmissive layers.

2. The fastener element for slide fasteners according to claim 1, wherein an edge of the light transmissive layer is formed toward the side of the fastener tape beyond a central line in the horizontal direction of a cross-section of the upper leg.

3. The fastener element for slide fasteners according to claim 1, wherein the light transmissive layer comprises a dielectric substance as a material.

4. The fastener element for slide fasteners according to claim 1, wherein the light transmissive layer comprises an electrically conductive compound, a colored compound or a metal or semiconductor as a material.

5. The fastener element for slide fasteners according to claim 4, wherein the layer thickness of a layer comprising the electrically conductive compound, the colored compound, or the metal or semiconductor as a material is 100 nm or less.

6. The fastener element for slide fasteners according to claim 1, wherein a layer comprising a resin as a material is formed outside of the light transmissive layer.

7. The fastener element for slide fasteners according to claim 6, wherein the layer comprising a resin as a material has a maximum film thickness of 500 nm or more.

8. The fastener element for slide fasteners according to claim 1, wherein a layer comprising a metal as a material is formed between the coating and the upper leg.

9. The fastener element for slide fasteners according to claim 8, wherein the layer comprising a metal as a material has a maximum layer thickness of 100 nm or less.

10. A slide fastener comprising the fastener element according to claim 1.

11. A coil-shaped fastener element for slide fasteners to be attached to a fastener tape,
wherein the fastener element comprises an engagement head, an upper leg, a lower leg and an inverting part connecting the upper leg and the lower leg,
wherein a coating comprising at least one light transmissive layer is formed at least in the upper leg,
wherein a layer thickness of the light transmissive layer is formed to gradually decrease from an approximate top of the upper leg toward a side of the fastener tape, and
wherein the layer thickness of the approximate top is about 50 nanometer (nm) to about 1500 nm at the maximum, and
wherein the light transmissive layer is formed by layering three or more light transmissive layers so that relative refraction indices of adjacent two layers are high/low in an alternate manner.

12. The fastener element for slide fasteners according to claim 11, wherein an edge of the light transmissive layer is formed toward the side of the fastener tape beyond a central line in the horizontal direction of a cross-section of the upper leg.

13. The fastener element for slide fasteners according to claim 11, wherein the light transmissive layer comprises a dielectric substance as a material.

14. The fastener element for slide fasteners according to claim 11, wherein the light transmissive layer comprises an electrically conductive compound, a colored compound or a metal or semiconductor as a material.

15. The fastener element for slide fasteners according to claim 14, wherein the layer thickness of a layer comprising the electrically conductive compound, the colored compound, or the metal or semiconductor as a material is 100 nm or less.

16. The fastener element for slide fasteners according to claim 15, wherein a layer comprising a resin as a material is formed outside of the light transmissive layer.

17. The fastener element for slide fasteners according to claim 16, wherein the layer comprising a resin as a material has a maximum film thickness of 500 nm or more.

18. The fastener element for slide fasteners according to claim 11, wherein a layer comprising a metal as a material is formed between the coating and the upper leg.

19. The fastener element for slide fasteners according to claim 18, wherein the layer comprising a metal as a material has a maximum layer thickness of 100 nm or less.

20. A slide fastener comprising the fastener element according to claim 11.

* * * * *

UNITED STATES PATENT AND TRADEMARK OFFICE
CERTIFICATE OF CORRECTION

| | |
|---|---|
| PATENT NO. | : 9,528,178 B2 |
| APPLICATION NO. | : 14/415787 |
| DATED | : December 27, 2016 |
| INVENTOR(S) | : Hideki Takeda et al. |

It is certified that error appears in the above-identified patent and that said Letters Patent is hereby corrected as shown below:

On the Title Page

In item (57), in Column 2, in "Abstract", Line 7, delete "light-transmissive" and insert -- light transmissive --, therefor.

In the Specification

In Column 2, Line 45, delete "polyester.urethane" and insert -- polyester urethane --, therefor.

In Column 6, Line 13, delete "Ni--Cr," and insert -- NiCr, --, therefor.

In Column 6, Line 62, delete "S-layer" and insert -- 3-layer --, therefor.

In Column 8, Line 62, delete "Example." and insert -- example. --, therefor.

In Column 12, Line 41, delete "thicknessat" and insert -- thickness at --, therefor.

In Column 12, Line 43, delete "Nb2O5" and insert -- $Nb_2O_5$ --, therefor.

In Column 12, Line 44, delete "SiO2" and insert -- $SiO_2$ --, therefor.

In Column 12, Line 45, delete "Nb2O5" and insert -- $Nb_2O_5$ --, therefor.

In Column 12, Line 46, delete "SiO2" and insert -- $SiO_2$ --, therefor.

In Column 12, Line 60, delete "Nb2O5" and insert -- $Nb_2O_5$ --, therefor.

In Column 12, Line 61, delete "SiO2" and insert -- $SiO_2$ --, therefor.

Signed and Sealed this
Twenty-eighth Day of February, 2017

Michelle K. Lee
*Director of the United States Patent and Trademark Office*

CERTIFICATE OF CORRECTION (continued)
U.S. Pat. No. 9,528,178 B2

In Column 12, Line 62, delete "Nb2O5" and insert -- $Nb_2O_5$ --, therefor.

In Column 12, Line 63, delete "SiO2" and insert -- $SiO_2$ --, therefor.

In Column 12, Line 64, delete "Nb2O5" and insert -- $Nb_2O_5$ --, therefor.

In Column 12, Line 65, delete "SiO2" and insert -- $SiO_2$ --, therefor.

In Columns 13-14, Line 17, delete "thicknessat" and insert -- thickness at --, therefor.